(12) United States Patent
Reyhani et al.

(10) Patent No.: US 6,396,424 B1
(45) Date of Patent: May 28, 2002

(54) BUBBLE SUPPRESSION METHOD AND APPARATUS

(75) Inventors: Hooman Reyhani; John Horan; John G. Ryan, all of Cork (IE)

(73) Assignee: Parthus Ireland Limited, Dublin (IE)

( * ) Notice: Subject to any disclaimer, the term of this patent is extended or adjusted under 35 U.S.C. 154(b) by 0 days.

(21) Appl. No.: 09/574,694

(22) Filed: May 17, 2000

Related U.S. Application Data
(60) Provisional application No. 60/135,826, filed on May 21, 1999.

(51) Int. Cl.[7] .................................................. H03M 1/56
(52) U.S. Cl. ......................................... 341/97; 341/50
(58) Field of Search .............................. 341/97, 50, 94, 341/96, 98, 156, 160; 371/37.1; 340/347

(56) References Cited

U.S. PATENT DOCUMENTS

| | | | | |
|---|---|---|---|---|
| 4,733,220 A | * | 3/1988 | Knierim | 340/347 |
| 5,257,270 A | * | 10/1993 | Hilden et al. | 371/37.1 |
| 5,329,279 A | * | 7/1994 | Barbu et al. | 341/50 |
| 5,633,636 A | | 5/1997 | Reyhani | |

OTHER PUBLICATIONS

"An 8–b ADC with Over–Nyquist Input at 300–Ms/s Conversion Rate", Nejime, et al., IEEE Journal of Solid–State Circuits, vol. 26, No. 9, Sep. 1991, pp. 1302–1308.

"A 400–MHz Input Flash Converter With Error Correction", Christopher W. Mangelsdorf, IEEE Journal of Solid–State Circuits, vol. 25, No. 1, Feb. 1990, pp. 184–191.

"A Dual 4–Bit 2–Gs/s Full Nyquist Analog–to–Digital Converter Using a 70–ps Silicon Bipolar Technology with Borosenic–Poly Process and Coupling–Base Implant", Garuts, et al., IEEE Journal of Solid–State Circuits, vol. 24, No. 2, Apr. 1989, pp. 216–222.

"A Monolithic 8–Bit A/D Converter with 120 MHz Conversion Rate", Inoue, et al., IEEE Journal of Solid–State Circuits, vol. 19, No. 6, 12–84, pp. 837–841.

"An 8b 350 MHz Flash ADC", 1987 IEEE International Solid–State Circuits Conference Digest of Technical Papers, Yoshii, et al., Feb. 1987, pp. 1–2 & 96–97.

"A 400MSPS 8b Flash AD Conversion LSI", 1987 IEEE International Solid–State Circuits Conference Digest of Technical Papers, Akazawa, et al., Feb., 1987, pp. 98–99 & 1–2.

"A 10b 20Ms/s 3V–Supply CMOS A/D Converter For Integration into System VLSIs", 1994 IEEE International Solid–State Circuits Conference Digest of Technical Papers, Miki, et al., pp. 48–49 & 1–2.

* cited by examiner

*Primary Examiner*—Peguy Jeanpierre
*Assistant Examiner*—Joseph Lauture
(74) *Attorney, Agent, or Firm*—Blakely, Sokoloff, Taylor & Zafman, LLP (57) ABSTRACT

A bubble suppression apparatus is disclosed comprising: a first set of AND gates, wherein each AND gate within the first set has an input configured to receive a binary thermometer code value and one or more adjacent binary thermometer code values; and a second set of AND gates, wherein each AND gate within the second set has an input coupled to two or more outputs of the first set of AND gates.

44 Claims, 6 Drawing Sheets

FIG. 1

*(prior art)*

Bubble Errors

| Bubble Depth | Ideal Code | A | B | C | D | E | F | G | H | I | J | K | L |
|---|---|---|---|---|---|---|---|---|---|---|---|---|---|
| +6 | 0 | 0 | 0 | 0 | 0 | 0 | 0 | 0 | 0 | 0 | 0 | 0 | 0 |
| +5 | 0 | 0 | 0 | 0 | 0 | 0 | 0 | 0 | 0 | 0 | 0 | 0 | 0 |
| +4 | 0 | 0 | 0 | 0 | 0 | 0 | 0 | 0 | 0 | 0 | 0 | 0 | 0 |
| +3 | 0 | 0 | 0 | 0 | 0 | 0 | 0 | 0 | 0 | 0 | 0 | 0 | 0 |
| +2 | 0 | 1 | 0 | 0 | 0 | 0 | 0 | 0 | 1 | 0 | 0 | 0 | 0 |
| +1 | 0 | 0 | 1 | 0 | 0 | 0 | 0 | 0 | 0 | 1 | 0 | 0 | 0 |
| 0 | 1 | 1 | 0 | 1 | 1 | 1 | 1 | 1 | 1 | 0 | 1 | 1 | 1 |
| -1 | 1 | 1 | 1 | 0 | 1 | 1 | 1 | 1 | 0 | 1 | 0 | 1 | 1 |
| -2 | 1 | 1 | 1 | 1 | 0 | 1 | 1 | 1 | 1 | 0 | 1 | 0 | 1 |
| -3 | 1 | 1 | 1 | 1 | 1 | 0 | 1 | 1 | 1 | 1 | 0 | 1 | 0 |
| -4 | 1 | 1 | 1 | 1 | 1 | 1 | 0 | 1 | 1 | 1 | 1 | 0 | 1 |
| -5 | 1 | 1 | 1 | 1 | 1 | 1 | 1 | 0 | 1 | 1 | 1 | 1 | 0 |
| -6 | 1 | 1 | 1 | 1 | 1 | 1 | 1 | 1 | 1 | 1 | 1 | 1 | 1 |

FIG. 2a

2-Bubble-Errors

| Bubble Depth | Ideal Code | A | B | C | D | E | F | G |
|---|---|---|---|---|---|---|---|---|
| +6 | 0 | 0 | 0 | 0 | 0 | 0 | 0 | 0 |
| +5 | 0 | 0 | 0 | 0 | 0 | 0 | 0 | 0 |
| +4 | 0 | 0 | 0 | 0 | 0 | 0 | 0 | 0 |
| +3 | 0 | 1 | 0 | 0 | 0 | 0 | 0 | 0 |
| +2 | 0 | 0 | 1 | 0 | 0 | 0 | 0 | 0 |
| +1 | 0 | 0 | 0 | 1 | 0 | 0 | 0 | 0 |
| 0 | 1 | 1 | 0 | 0 | 1 | 1 | 1 | 1 |
| -1 | 1 | 1 | 1 | 0 | 0 | 1 | 1 | 1 |
| -2 | 1 | 1 | 1 | 1 | 0 | 0 | 1 | 1 |
| -3 | 1 | 1 | 1 | 1 | 1 | 0 | 0 | 1 |
| -4 | 1 | 1 | 1 | 1 | 1 | 1 | 0 | 0 |
| -5 | 1 | 1 | 1 | 1 | 1 | 1 | 1 | 0 |
| -6 | 1 | 1 | 1 | 1 | 1 | 1 | 1 | 1 |

3-Bubble-Errors

| Bubble Depth | Ideal Code | A | B | C | D | E | F | G | H |
|---|---|---|---|---|---|---|---|---|---|
| +6 | 0 | 0 | 0 | 0 | 0 | 0 | 0 | 0 | 0 |
| +5 | 0 | 0 | 0 | 0 | 0 | 0 | 0 | 0 | 0 |
| +4 | 0 | 1 | 0 | 0 | 0 | 0 | 0 | 0 | 0 |
| +3 | 0 | 0 | 1 | 0 | 0 | 0 | 0 | 0 | 0 |
| +2 | 0 | 0 | 0 | 1 | 0 | 0 | 0 | 0 | 0 |
| +1 | 0 | 0 | 0 | 0 | 1 | 0 | 0 | 0 | 0 |
| 0 | 1 | 1 | 0 | 0 | 0 | 1 | 1 | 1 | 1 |
| -1 | 1 | 1 | 1 | 0 | 0 | 0 | 1 | 1 | 1 |
| -2 | 1 | 1 | 1 | 1 | 0 | 0 | 0 | 1 | 1 |
| -3 | 1 | 1 | 1 | 1 | 1 | 0 | 0 | 0 | 1 |
| -4 | 1 | 1 | 1 | 1 | 1 | 1 | 0 | 0 | 0 |
| -5 | 1 | 1 | 1 | 1 | 1 | 1 | 1 | 0 | 0 |
| -6 | 1 | 1 | 1 | 1 | 1 | 1 | 1 | 1 | 0 |
| -7 | 1 | 1 | 1 | 1 | 1 | 1 | 1 | 1 | 1 |

FIG. 3b $$Rom(n) = \left[\overline{(\overline{C_{n+1}} \cdot C_n \cdot C_{n-1}) \cdot (\overline{\overline{C_{n+4}} \cdot C_{n+3} \cdot C_{n+2}}) \cdot (\overline{\overline{C_{n+5}} \cdot C_{n+4} \cdot C_{n+3}})}\right] \cdot$$

$$\overline{\left[(\overline{C_{n+6}} \cdot C_{n+5} \cdot C_{n+4}) \cdot (\overline{\overline{C_{n+9}} \cdot C_{n+8} \cdot C_{n+7}}) \cdot (\overline{\overline{C_{n+10}} \cdot C_{n+9} \cdot C_{n+8}})\right]} \cdot$$

$$\overline{\left[(\overline{C_{n+7}} \cdot C_{n+6} \cdot C_{n+5}) \cdot (\overline{\overline{C_{n+10}} \cdot C_{n+9} \cdot C_{n+8}}) \cdot (\overline{\overline{C_{n+11}} \cdot C_{n+10} \cdot C_{n+9}})\right]}$$

FIG. 4

BUBBLE SUPPRESSION METHOD AND APPARATUS

This application claims the benefit of the filing date for U.S. Provisional Application No. 60/135,826, filed May 21, 1999.

BACKGROUND OF THE INVENTION

1. Field of the Invention

This invention relates generally to parallel analog-to-digital converters (ADCs) and more particularly to techniques for reducing output errors on a flash ADC.

2. Description of the Related Art

Figure 1:
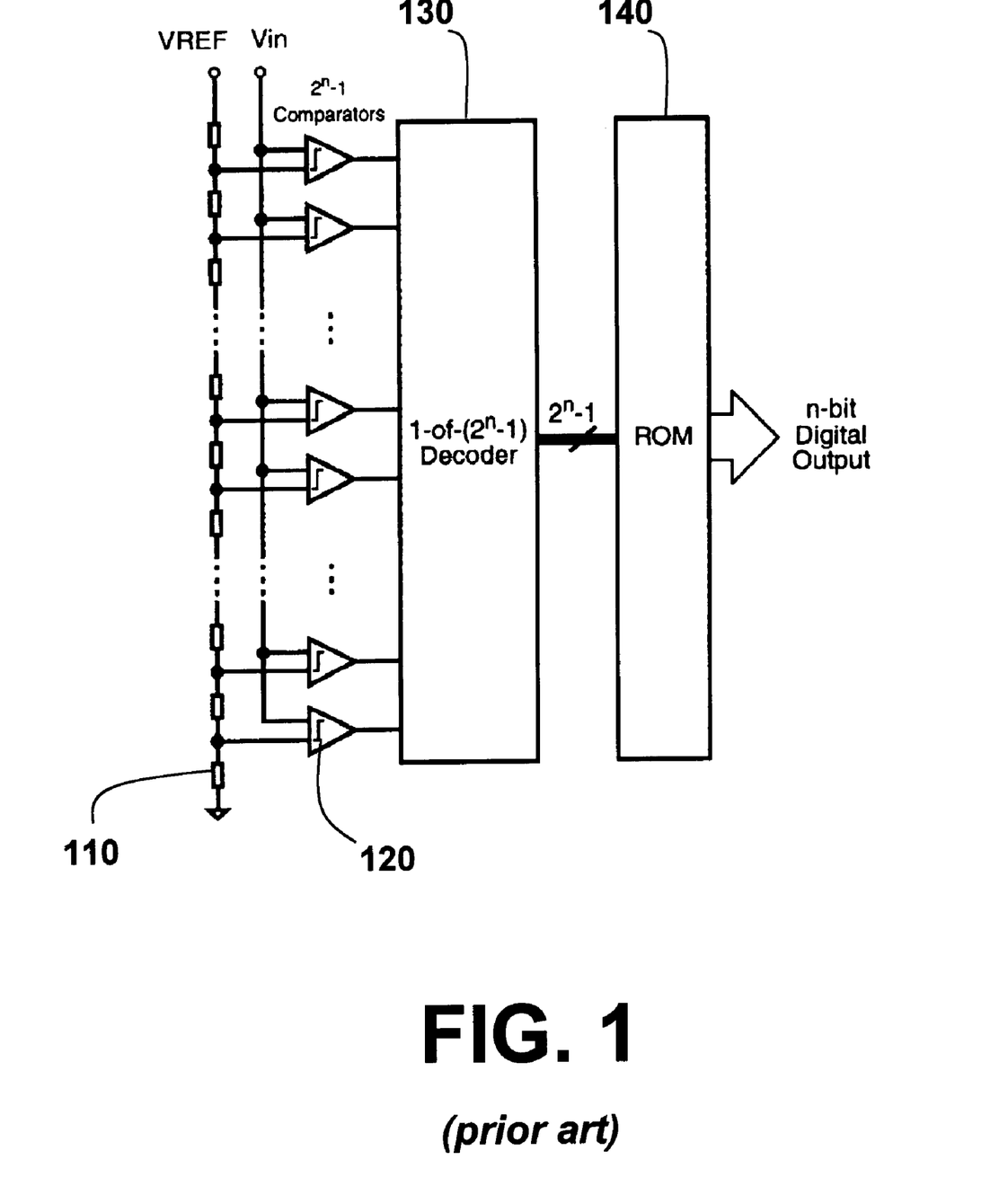
FIG. 1 illustrates a prior art flash analog-to-digital converter.

The objective of analog-to-digital ("ADC") converters is to receive an analog signal and produce an error free digitized version of that analog signal. A well known ADC circuit is a parallel or "flash" ADC, which receives an analog signal to be digitized and compares its voltage to a set of reference voltages. As illustrated in FIG. 1, for "n" bits of resolution in the ADC's digital output, a known voltage is applied to a ladder of $2^n$ series resistors 110 to provide reference voltages at the nodes between the resistors 110. Comparators 120, typically implemented with high gain amplifiers, receive respective reference voltages at one input and the analog input signal at another input to produce either a low output (binary 0) if the comparator's reference voltage is greater than the analog input, or a high or "active" output (binary 1) if the analog input is higher than the comparator's reference voltage. Ideally, the resulting digital comparator 120 outputs, referred to as "thermometer code," are a series of binary 0s for comparators which receive reference voltages greater than the analog input signal, and a series of binary is for comparators which receive a reference voltage less than the analog input signal. The transition from binary 0s to 1s indicates the amplitude of the analog input signal.

In a typical flash-type Analog-to-Digital Converter (ADC) shown in FIG. 1, the task of the digital back-end is to process the thermometer code output of the $2^n-1$ comparators 120 and generate an equivalent n-bit digital binary output. There are numerous ways of achieving this goal. One commonly used scheme is to configure a 1-of-($2^n-1$) decoder 130 followed by a Read-Only-Memory (ROM) 140 look-up table. The decoder 130 detects the 0-to-1 transition in the thermometer code output of the comparators 120 and activates the corresponding output line which enables a ROM address to place its contents on the output data-bus.

When high slew-rate input signals are sampled, timing skew between the clock and signal paths and differences in comparator 120 response-times can cause the effective strobe point of the comparators to be different. This can lead to an irregular thermometer code pattern where a 0 can be found below a 1 or a 1 above a 0. These unwanted irregularities are known as "bubbles" and if they are not adequately suppressed they can cause severe ROM output errors, known as "sparkle" code errors, as more than one address can become enabled at the same time. These large output errors can have significant impact on the Signal-to-Noise Ratio (SNR) performance of the ADC.

Several methods of preventing bubbles from causing sparkle code errors have been reported. The suppression scheme may be implemented in the 1-of-($2^n-1$) decoder and/or in the ROM. Some of the well known schemes include "Democratic Decoding" (C. W. Mangelsdorf, "A 400 MHz Input Flash Converter with Error Correction", IEEE J. Solid-State Circuits, vol. 25, pp. 184–191, February 1990); "Quasi-Gray" Code (Y. Akazawa et al., "A 400MSPS 8-bit Flash A/D Conversion LSI", in ISSCC Dig. Tech. Papers, pp. 98–99, February 1987); "Half-Gray" Code (U.S. Pat. No. 5,633,636. Title: Half-Gray Digital Encoding Method and Circuitry". Date: May 27, 1997); "Bit-Swap" techniques (V. E. Garuts et al., "A Dual 4-bit 2Gs/s Full Nyquist Analog-to-Digital Converter using a 70 ps Silicon Bipolar Technology with Borosenic-Poly Process and Coupling-Base Implant", IEEE J. Solid-State Circuits, vol. 24, pp. 216–222, April 1989); and several multi-level ROM topologies. Most of these schemes, however, are quite complex and more suitable to lower sampling rates or, alternatively, require a high-speed bipolar technology which will dissipate large amounts of power.

SUMMARY OF THE INVENTION

A bubble suppression apparatus is disclosed comprising: a first set of AND gates, wherein each AND gate within the first set has an input configured to receive a binary thermometer code value and one or more adjacent binary thermometer code values; and a second set of AND gates, wherein each AND gate within the second set has an input coupled to two or more outputs of the first set of AND gates.

BRIEF DESCRIPTION OF THE DRAWINGS

A better understanding of the present invention can be obtained from the following detailed description in conjunction with the following drawings, in which.

DETAILED DESCRIPTION

In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form to avoid obscuring the underlying principles of the invention.

Embodiments of the present invention include various steps, which will be described below. The steps may be embodied in machine-executable instructions or, alternatively, these steps may be performed by specific hardware components that contain hardwired logic for performing the steps (e.g., an integrated circuit), or by any combination of programmed computer components and custom hardware components.

Elements of the present invention may also be provided as a machine-readable medium for storing machine-executable instructions or other types of code/data (e.g., VHDL code). The machine-readable medium may include, but is not limited to, floppy diskettes, optical disks, CD-ROMs, and magneto-optical disks, ROMs, RAMs, EPROMs, EEPROMs, magnet or optical cards, propagation media or other type of media/machine-readable medium suitable for storing code/data. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

EMBODIMENTS OF THE INVENTION

As used herein, "ideal thermometer code" refers to error-free thermometer code, wherein a contiguous set of zeros is followed by a contiguous set of ones. In the illustrations and examples set forth below, "ideal" thermometer code will be defined by thermometer code with zeros above ones. It should be noted, however, that the underlying principles of the invention may be implemented with "ideal" thermometer code having ones above zeros.

Figure 2A:
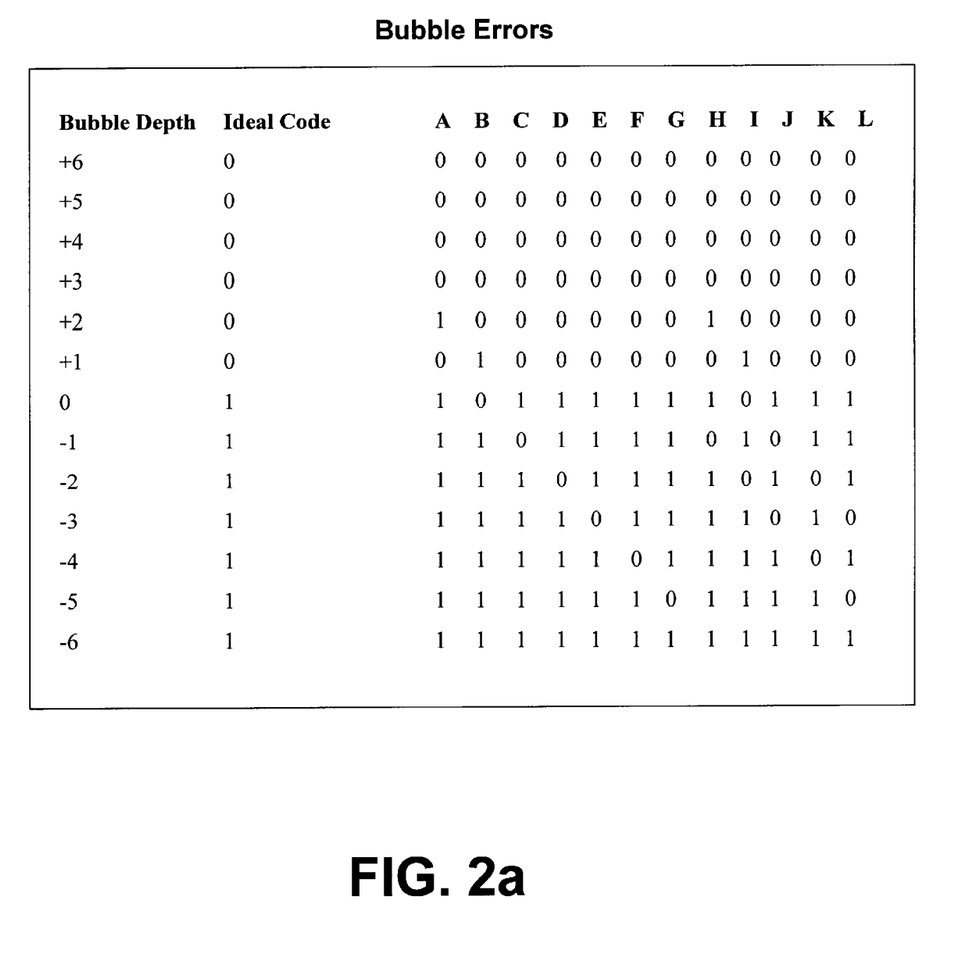
FIG. 2a illustrates the concept of bubble errors which are corrected by embodiments of the invention.
Figure 2B:
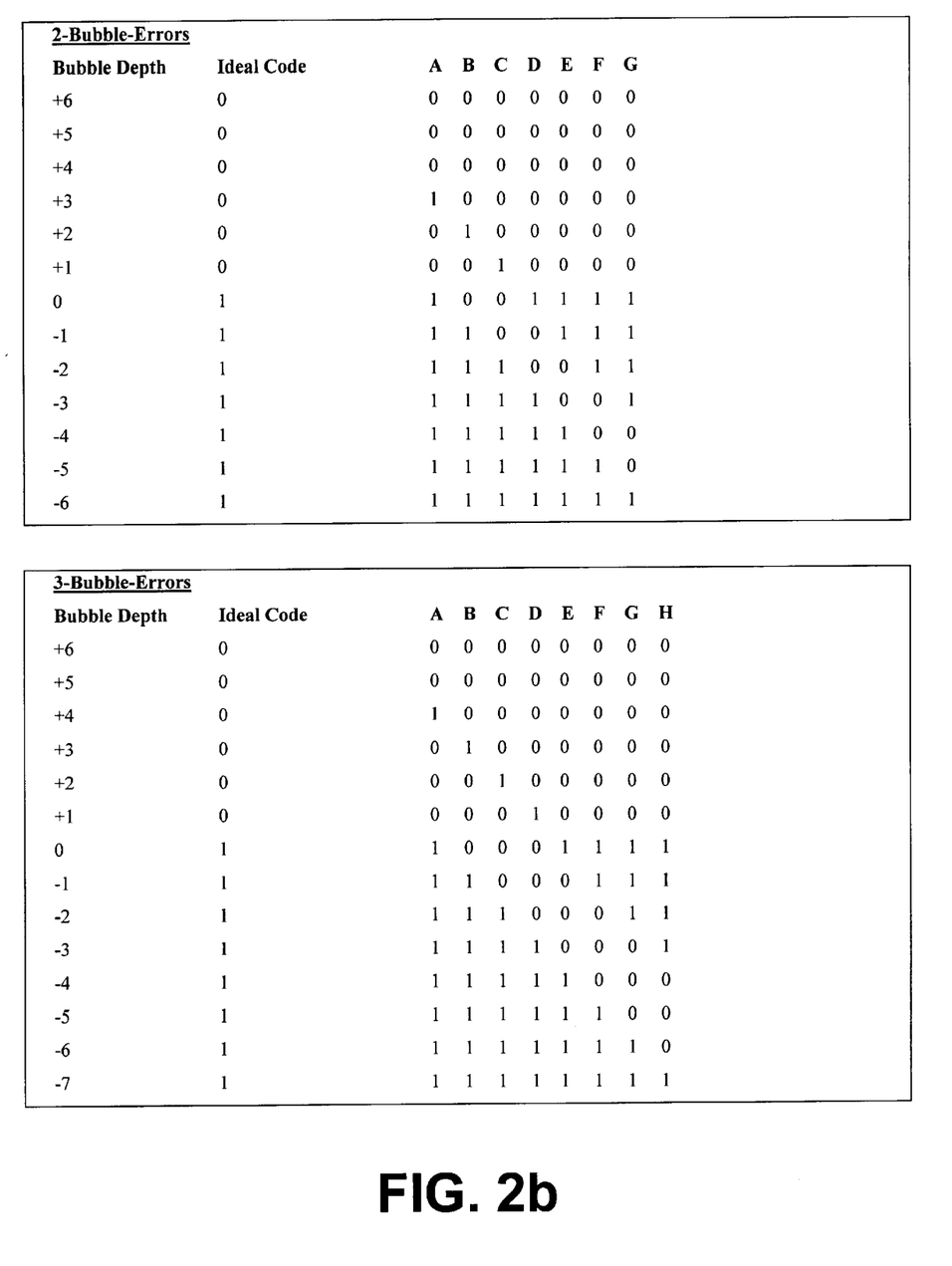
FIG. 2b illustrates the concepts of 2-bubble errors and 3-bubble-errors which are corrected by embodiments of the invention.

A "bubble" refers to an error in thermometer code wherein a 0 is encountered below a 1 in the thermometer code. "Bubble depth" refers to the position of the bubble with respect to the 0-to-1 transition in the ideal thermometer code (i.e., depth=0). This concept is illustrated in FIG. 2a. "N-Bubble-Error" refers to the size of the bubble. The most common types are "1-Bubble-Errors" (a 0 with at least a 1 above and below); "2-Bubble-Errors" (two 0s below at least a 1); and "3-Bubble-Errors" (three 0s below at least a 1). FIG. 2b illustrates 2-Bubble-Errors and 3-Bubble-Errors, respectively.

A new, look-ahead bubble-suppression apparatus and method will now be described. The apparatus and method relies on the fact that when a 2-input gate or greater is used to detect the 0-to-1 transition in the thermometer code output of the comparators, a bubble will cause two or more addresses of known distance apart to become selected. Therefore, within reason it is possible to disable all but one of the selected addresses and hence ensure correct operation of the ROM.

Figure 3A:
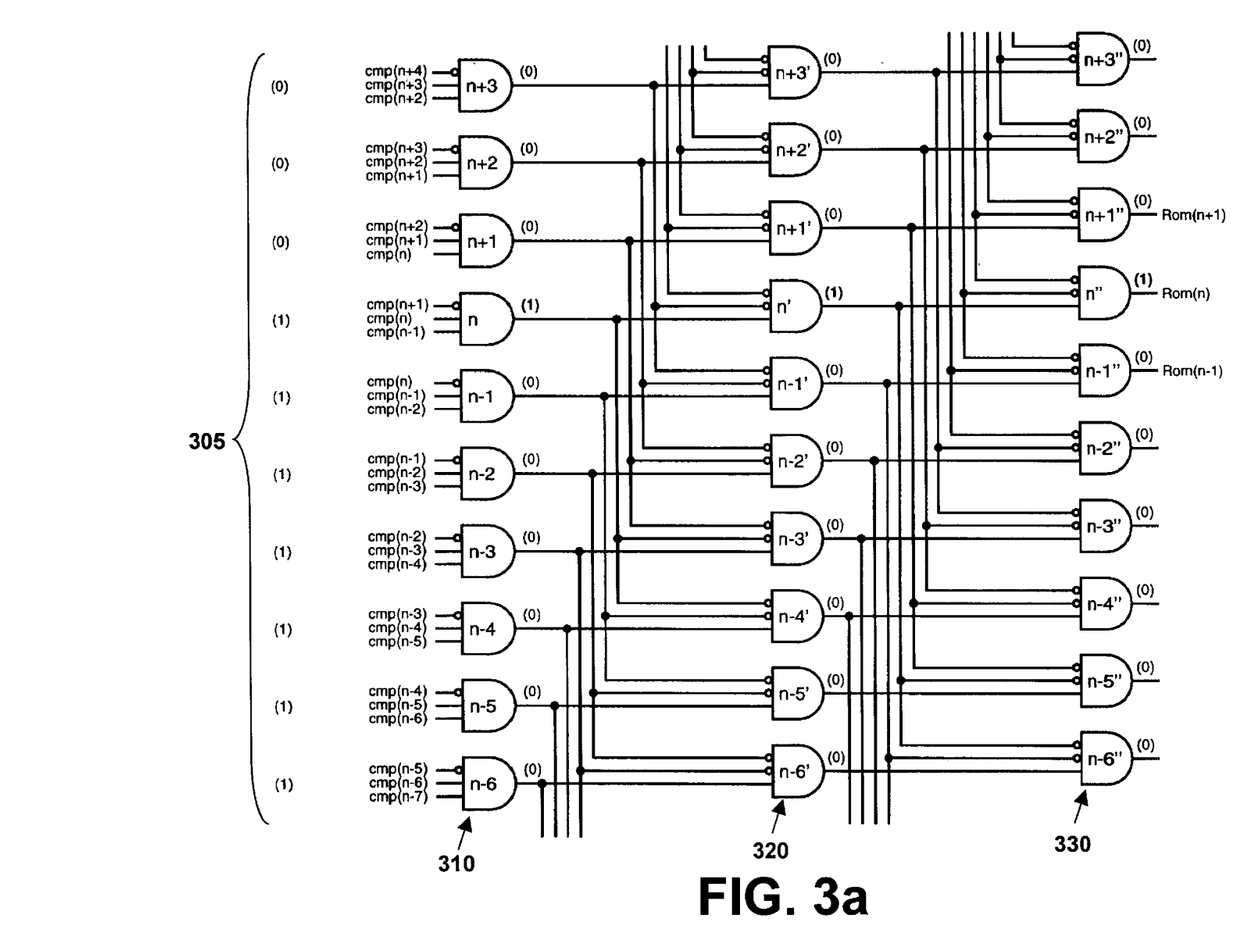
FIG. 3a illustrates one embodiment of the invention to which error-free thermometer code is applied.

FIG. 3a illustrates one possible embodiment of the invention where 3-input AND/NAND gates have been used throughout (the gates are NAND gates to the extent that some inputs are inverted and are AND gates to the extent that some inputs are not inverted). More particularly, in the embodiment illustrated in FIG. 3a, the thermometer code 305 is passed through multiple sets of AND/NAND gates 310, 320, and 330 to filter out bubbles. FIG. 3a also shows the correct operation of this embodiment when an ideal thermometer code 305 (without any bubbles) is applied.

Figure 3B:
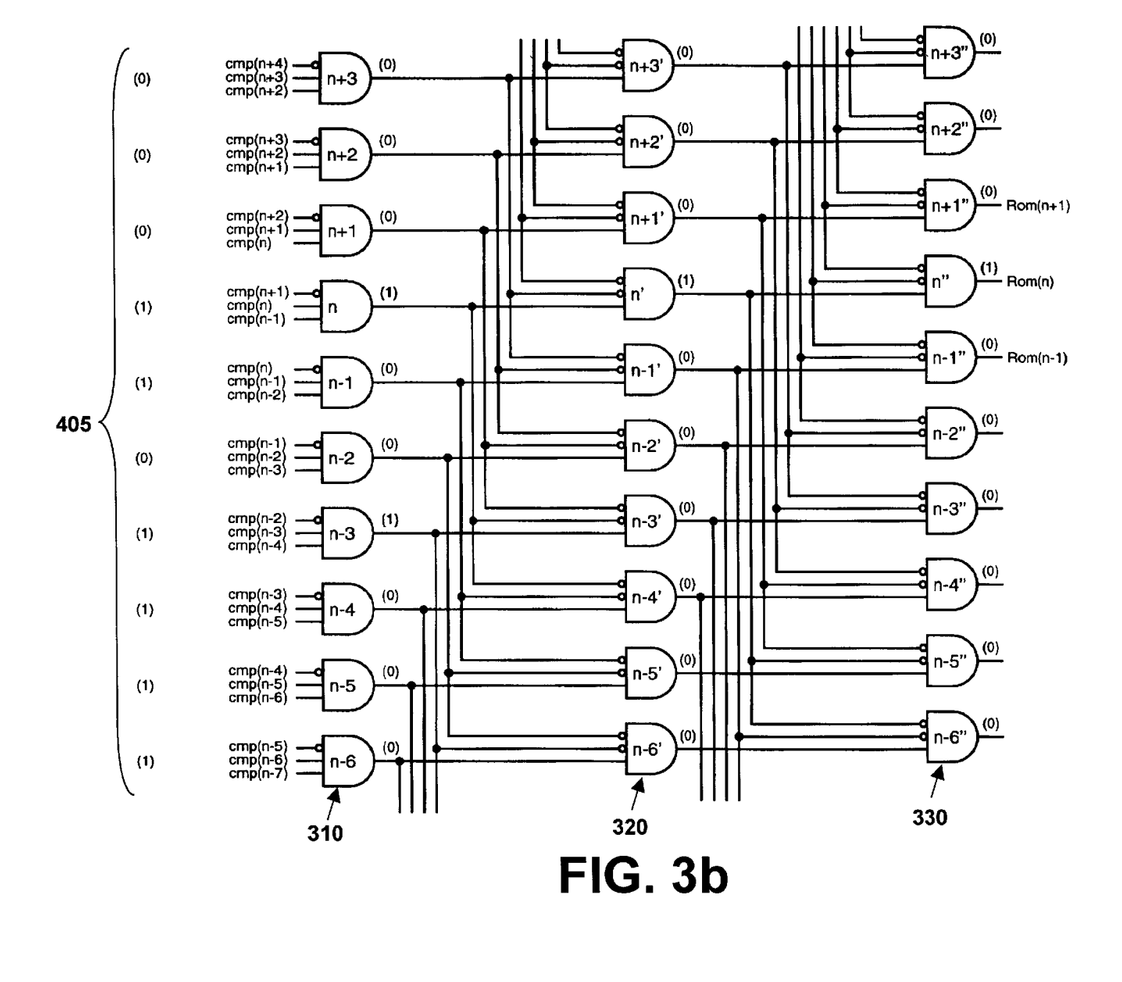
FIG. 3b illustrates one embodiment of the invention to which thermometer code with a single bubble error is applied.

FIG. 3b shows the same embodiment, but in FIG. 3b an irregular thermometer code 405 containing a single bubble error of depth (−2) is applied. The effect of this particular thermometer code is to activate the outputs of both gates (n) and (n−3) in the first set of gates 310. In the absence of the second set of gates 320 and/or the third set of gates 330, the two activated lines would select and enable two ROM addresses at the same time, thereby causing an error in the output code.

However, in the illustrated embodiment, the usage of first and second sets of gates 320 and 330 prevents the occurrence of this type of error by ensuring that only one ROM address can become selected at any one time (i.e., these gates remove bubbles from the ROM code transmitted from the first set of gates 310). In this embodiment, the output of each of the first set of gates 310 is coupled to the input of three gates at the second level of gates 320. More particularly, the output of gate (n) is used to disable gates (n−3') and (n−4') (i.e., the active state or '1'0 output from gate (n) is inverted to a '0' and is applied to gates (n−3') and (n−4')). In addition, the output of gate (n) is passed directly through to gate (n'). The end result—using the thermometer code example of FIG. 3b—is that the bubble output from gate (n−3) is filtered out by the inverted output of gate (n) applied to gate (n−3'). It should be noted that a bubble error of depth (−3) would be filtered in a similar manner (i.e., the active state or '1' from gate (n−4) would be filtered by the inverted output of gate (n) applied to gate (n−4').

If a particular bubble is not filtered out by the second set of gates 320 it may still be filtered by a third set of gates 330 as illustrated in FIG. 3b. For example, if a bubble caused the output of gate (n−5) to activate improperly, it would pass through the first set of gates 320 (e.g., if the correct active gate is the output of gate (n) as illustrated), but it would be filtered at the second set of gates 330 by the active output of gate (n'), which is inverted and applied to gate (n−5"). Accordingly, only the output of gate (n) will remain active past the progress forward to activate the ROM.

Figure 4:
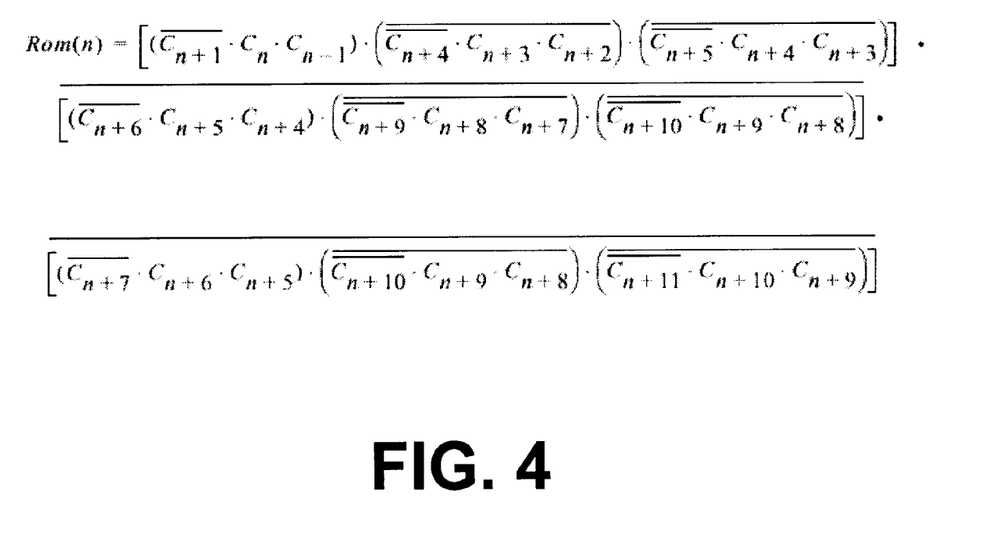
FIG. 4 illustrates an equation used to suppress bubbles according to one embodiment of the invention.

One particular embodiment of the invention employs the equation illustrated in FIG. 4 to suppress bubbles when selecting a value at address 'n' in the ROM. As used in the equation, $C_n$ is a binary thermometer code value and $C_{n+1}$ and $C_{n-1}$ are thermometer code values just above and below $C_n$, respectively (similarly, $C_{n+2}$ is two thermometer code values above $C_n$, etc.). It should be noted, however, that the equation set forth in FIG. 4 is for the purpose of illustration only and is not necessary for complying with the underlying principles of the invention.

It is important to note that the apparatus and method described herein may be implemented in environments other than a physical integrated circuit ("IC"). For example, the circuitry may be incorporated into a format or machine-readable medium for use within a software tool for designing a semiconductor IC. Examples of such formats and/or media include computer readable media having a VHSIC Hardware Description Language ("VHDL") description, a Register Transfer Level ("RTL") netlist, and/or a GDSII description with suitable information corresponding to the described apparatus and method.

Throughout the foregoing description, for the purpose of explanation, numerous specific details were set forth in order to provide a thorough understanding of the invention. It will be apparent, however, to one skilled in the art that the invention may be practiced without some of these specific details. For example, while the embodiments illustrated in FIGS. 3a and 3b apply the inverted outputs of each gate the first set of gates 310 (e.g., in position (n)) to gates which are offset by three and four gates in the second set 320 (e.g., (n−3') and (n−4'), respectively), various alternative configurations may be implemented while still complying with the underlying principles of the invention. Similarly, although the outputs of each of the gates in the second set 320 are used as inverted inputs to gates offset by five and six gates in the second set (e.g., gates (n−5") and (n−6"), respectively, with reference to gate (n")), such a configuration is not necessary for complying with the underlying principles of the invention. Accordingly, the scope and spirit of the invention should be judged in terms of the claims which follow.

What is claimed is:

1. A bubble suppression apparatus comprising:
   a first set of AND gates, wherein each AND gate within said first set has an input configured to receive a binary thermometer code value and one or more adjacent binary thermometer code values and an output comprising a lookup signal indicating a particular code word stored in a memory; and a second set of AND gates, wherein each AND gate within said second set has an input coupled to a primary lookup signal transmitted from one of said first set of AND gates and one or more filtering lookup signals transmitted from one or more additional AND gates in said first set, and an output comprising a filtered lookup signal.

2. The bubble suppression apparatus as in claim 1 further comprising:

a third set of AND gates, wherein each AND gate within said third set has an input coupled to a primary filtered lookup signal transmitted from one of said second set of AND gates and one or more second-tier filtering lookup signals transmitted from one or more additional AND gates in said second set, and an output comprising a second-filtered lookup signal.

3. The bubble suppression apparatus as in claim 1 wherein each AND gate within said first set is configured to have as an input:

a binary thermometer code value having first and second adjacent thermometer code values;

said first adjacent thermometer code value; and said second adjacent thermometer code value inverted.

4. The bubble suppression apparatus as in claim 3 wherein each AND gate within said second set is configured to have as an input:

a non-inverted output of one of said AND gates in said first set; and two individual inverted outputs of two of said AND gates in said first set.

5. The bubble suppression apparatus as in claim 4 further comprising:

a third set of AND gates, wherein each AND gate within said third is configured to have as an input:

a non-inverted output of one of said AND gates in said second set; and two individual inverted outputs of two of said AND gates in said second set.

6. The bubble suppression apparatus as in claim 4 wherein said inverted outputs of said first set of AND gates are configured as inputs to particular AND gates in said second set based on a predetermined logical relationship between said non-inverted output and said inverted outputs.

7. The bubble suppression apparatus as in claim 6 wherein said predetermined logical relationship between said non-inverted output and said two inverted outputs is that said AND gates producing said two inverted outputs are logically separated from said AND gate producing said non-inverted output by three and four AND gates, respectively.

8. The bubble suppression apparatus as in claim 5 wherein said inverted outputs of said second set of AND gates are configured as inputs to particular AND gates in said third set based on a predetermined logical relationship between said non-inverted output and said inverted outputs.

9. The bubble suppression apparatus as in claim 8 wherein said predetermined logical relationship between said non-inverted output and said two inverted outputs is that said AND gates producing said two inverted outputs are logically separated from said AND gate producing said non-inverted output by five and six AND gates, respectively.

10. A method for suppressing bubbles in thermometer code comprising:

transmitting said thermometer code through a first set of AND gates to produce a first ROM code; and transmitting said first ROM code through a second series of AND gates to filter out bubbles in said first ROM code and produce a first filtered ROM code for enabling a ROM address, each AND gate in said second series having as an input at least one primary ROM code value and one filtering ROM code value.

11. The method as in claim 10 further comprising:

transmitting said second ROM code through a third series of AND gates to filter out bubbles in said second ROM code and produce a second filtered ROM code for enabling a ROM address, each AND gate in said second series having as an input at least one primary first-filtered ROM code value and one filtering first-filtered ROM code value.

12. The method as in claim 10 wherein transmitting said thermometer code through said first set of AND gates comprises:

transmitting at an input to each AND gate three binary values, two of said binary values being a first two adjacent binary values in said thermometer code, and a third binary value being an inverted binary value of said thermometer code adjacent to one of said first two adjacent binary values.

13. The method as in claim 12 wherein transmitting said first ROM code through a second series of AND gates comprises:

transmitting at an input to each AND gate in said second set three binary values, one of said binary values being a non-inverted binary value in said ROM code; and two of said binary values being inverted binary values in said ROM code separated by said non-inverted binary value by a predetermined amount.

14. The method as in claim 13 wherein said predetermined amount is three binary spaces and four binary spaces, respectively.

15. The method as in claim 11 wherein transmitting said second ROM code through a third series of AND gates comprises:

transmitting at an input to each AND gate in said third set three binary values, one of said binary values being a non-inverted binary value in said second ROM code; and two of said binary values being inverted binary values in said second ROM code separated by said non-inverted binary value by a predetermined amount.

16. The method as in claim 15 wherein said predetermined amount is five binary spaces and six binary spaces, respectively.

17. A bubble-suppression apparatus comprising:

first ROM code generation logic for receiving a thermometer code and generating a ROM code in response; and bubble suppression means for receiving said ROM code and filtering any bubbles contained therein.

18. The bubble-suppression apparatus as in claim 17 wherein said bubble suppression means comprises a first set of AND gates for filtering bubbles from said ROM code to generate a second ROM code.

19. The bubble-suppression apparatus as in claim 18 wherein said bubble suppression means further comprises a second set of AND gates for filtering bubbles from said second ROM code which were not filtered by said first set of AND gates.

20. A machine-readable medium having code stored thereon which defines an integrated circuit (IC), said IC comprising:

a first set of AND gates, wherein each AND gate within said first set has an input configured to receive a binary thermometer code value and one or more adjacent binary thermometer code values and an output comprising a lookup signal indicating a particular code word stored in a memory; and a second set of AND gates, wherein each AND gate within said second set has an input coupled to a primary lookup signal transmitted from one of said first set of AND gates and one or more filtering lookup signals transmitted from one or more additional AND gates in said first set, and an output comprising a filtered lookup signal.

21. The machine readable medium of claim 20 further comprising code which defines:

a third set of AND gates, wherein each AND gate within said third set has an input coupled to a primary filtered lookup signal transmitted from one of said second set of AND gates and one or more second-tier filtering lookup signals transmitted from one or more additional AND gates in said second set, and an output comprising a second-filtered lookup signal.

22. The machine readable medium of claim 21 wherein each AND gate within said first set is configured to have as an input:

a binary thermometer code value having first and second adjacent thermometer code values;

said first adjacent thermometer code value; and said second adjacent thermometer code value inverted.

23. The machine readable medium of claim 22 wherein each AND gate within said second set is configured to have as an input:

a non-inverted output of one of said AND gates in said first set; and two individual inverted outputs of two of said AND gates in said first set.

24. The machine readable medium of claim 23 further comprising code which defines:

a third set of AND gates, wherein each AND gate within said third is configured to have as an input:

a non-inverted output of one of said AND gates in said second set; and two individual inverted outputs of two of said AND gates in said second set.

25. The machine readable medium of claim 24 wherein said inverted outputs of said first set of AND gates are configured as inputs to particular AND gates in said second set based on a predetermined logical relationship between said non-inverted output and said inverted outputs.

26. The machine readable medium of claim 25 wherein said predetermined logical relationship between said non-inverted output and said two inverted outputs is that said AND gates producing said two inverted outputs are logically separated from said AND gate producing said non-inverted output by three and four AND gates, respectively.

27. The machine readable medium of claim 26 wherein said inverted outputs of said second set of AND gates are configured as inputs to particular AND gates in said third set based on a predetermined logical relationship between said non-inverted output and said inverted outputs.

28. The machine readable medium of claim 27 wherein said predetermined logical relationship between said non-inverted output and said two inverted outputs is that said AND gates producing said two inverted outputs are logically separated from said AND gate producing said non-inverted output by five and six AND gates, respectively.

29. An apparatus for removing bubbles from a plurality of sequentially-ordered lookup signals, said lookup signals indicating a particular code word stored in a memory, comprising:

a first filtering column of logically ordered AND gates, wherein each AND gate within said column receives as its input a primary lookup signal as well as one or more filtering lookup signals, said one or more filtering lookup signals being either inverted or non-inverted based on said filtering lookup signals' logical relationship to said primary lookup signal, and wherein each of said filtering lookup signals for a particular AND gate are primary lookup signals for a different AND gate in said first filtering column.

30. The apparatus as in claim 29 further comprising:

a thermometer code translation column of logically ordered AND gates to convert thermometer code into said lookup signals, each AND gate to receive at its input a primary thermometer code signal and one or more filtering thermometer code signals, said one or more filtering thermometer code signals being inverted or non-inverted based on said filtering thermometer code signals' logical relationship to said primary thermometer code signal.

31. The apparatus as in claim 30 further comprising:

a second filtering column of logically ordered AND gates, wherein each AND gate within said second filtering column receives as its input a second-tier primary lookup signal transmitted from an output of a respective AND gate in said first filtering column as well as one or more second-tier filtering lookup signals, said one or more second-tier filtering lookup signals being either inverted or non-inverted based on said second-tier filtering lookup signals' logical relationship to said second-tier primary lookup signal, and wherein each of said second-tier filtering lookup signals for a particular AND gate are second-tier primary lookup signals for a different AND gate.

32. The apparatus as in claim 29 wherein each AND gate has two filtering lookup signals as inputs.

33. The apparatus as in claim 32 wherein each of said two filtering input signals are inverted.

34. The apparatus as in claim 30 wherein an AND gate in logical position 'N' in relation to other AND gates in said thermometer code translation column, receives thermometer code signal 'N' in relation to other thermometer code values, as a primary thermometer code signal, and receives inverted filtering thermometer code signal 'N+1' and non-inverted thermometer code signal 'N−1' as first and second filtering thermometer code signals, respectively.

35. The apparatus as in claim 34 wherein an output of AND gate 'N' is lookup signal 'N' in relation to other lookup signals.

36. The apparatus as in claim 35 wherein each AND gate which receives as an input lookup signal 'N' as a primary lookup signal, also receives inverted lookup signals 'N+3' and 'N+4' as first and second filtering lookup signals, respectively.

37. A machine-readable medium having code stored thereon which defines an integrated circuit (IC), said IC comprising:

a first filtering column of logically ordered AND gates, wherein each AND gate within said column receives as its input a primary lookup signal as well as one or more filtering lookup signals, said one or more filtering lookup signals being either inverted or non-inverted based on said filtering lookup signals' logical relationship to said primary lookup signal, and wherein each of said filtering lookup signals for a particular AND gate are primary lookup signals for a different AND gate in said first filtering column.

38. The machine-readable medium as in claim 37 wherein said IC further comprises:

a thermometer code translation column of logically ordered AND gates to convert thermometer code into said lookup signals, each AND gate to receive at its input a primary thermometer code signal and one or more filtering thermometer code signals, said one or more filtering thermometer code signals being inverted or non-inverted based on said filtering thermometer code signals' logical relationship to said primary thermometer code signal.

39. The machine-readable medium as in claim 38 wherein said IC further comprises:

a second filtering column of logically ordered AND gates, wherein each AND gate within said second filtering column receives as its input a second-tier primary lookup signal transmitted from an output of a respective AND gate in said first filtering column as well as one or more second-tier filtering lookup signals, said one or more second-tier filtering lookup signals being either inverted or non-inverted based on said second-tier filtering lookup signals' logical relationship to said second-tier primary lookup signal, and wherein each of said second-tier filtering lookup signals for a particular AND gate are second-tier primary lookup signals for a different AND gate.

40. The machine-readable medium as in claim 37 wherein each AND gate has two filtering lookup signals as inputs.

41. The machine-readable medium as in claim 40 wherein each of said two filtering input signals are inverted.

42. The machine-readable medium as in claim 38 wherein an AND gate in logical position 'N' in relation to other AND gates in said thermometer code translation column, receives thermometer code signal 'N' in relation to other thermometer code values, as a primary thermometer code signal, and receives inverted filtering thermometer code signal 'N+1' and non-inverted thermometer code signal 'N−1' as first and second filtering thermometer code signals, respectively.

43. The machine-readable medium as in claim 42 wherein an output of AND gate 'N' is lookup signal 'N' in relation to other lookup signals.

44. The machine-readable medium as in claim 43 wherein each AND gate which receives as an input lookup signal 'N' as a primary lookup signal, also receives inverted lookup signals 'N+3' and 'N+4' as first and second filtering lookup signals, respectively.

* * * * *

UNITED STATES PATENT AND TRADEMARK OFFICE
CERTIFICATE OF CORRECTION

PATENT NO. : 6,396,424 B1
DATED : May 28, 2002
INVENTOR(S) : Reyhani et al.

It is certified that error appears in the above-identified patent and that said Letters Patent is hereby corrected as shown below:

Column 1,
Line 34, delete "is" and insert -- 1s --.

Column 4,
Line 3, delete "'1'0" and insert -- '1' --.

Signed and Sealed this

Sixth Day of August, 2002

Attest:

JAMES E. ROGAN
Attesting Officer      Director of the United States Patent and Trademark Office